United States Patent [19]

Kannegundla

[11] Patent Number: 5,321,315
[45] Date of Patent: Jun. 14, 1994

[54] TRACKING CONTROL PULSE GENERATION FOR VARIABLE FRAME RATE CCD SENSORS FOR ELECTRONIC IMAGING APPLICATIONS

[75] Inventor: Ram Kannegundla, Rochester, N.Y.

[73] Assignee: Eastman Kodak Company, Rochester, N.Y.

[21] Appl. No.: 848,620

[22] Filed: Mar. 9, 1992

[51] Int. Cl.$^5$ .................................... H03K 3/017
[52] U.S. Cl. .................................... 307/265; 307/269; 307/511; 307/518; 307/603; 328/58
[58] Field of Search ............... 307/265, 269, 511, 518, 307/602, 603; 328/62, 63, 58

[56] References Cited

U.S. PATENT DOCUMENTS

| | | | |
|---|---|---|---|
| 4,004,162 | 1/1977 | Kato et al. | 307/269 |
| 4,414,637 | 11/1983 | Stanley | 328/63 |
| 4,423,383 | 12/1983 | Svendsen | 328/63 |
| 4,623,846 | 11/1986 | La Macchia | 307/265 |
| 4,683,495 | 7/1987 | Brock | 307/518 |
| 4,710,721 | 12/1987 | Camus | 328/109 |
| 4,891,828 | 1/1986 | Kawazoe | 307/265 |
| 4,998,025 | 3/1991 | Watanabe | 307/269 |
| 5,077,529 | 12/1991 | Ghoshal | 328/155 |
| 5,265,063 | 11/1993 | Kogure | 328/63 |

Primary Examiner—Timothy P. Callahan
Assistant Examiner—Terry D. Cunningham
Attorney, Agent, or Firm—Raymond L. Owens

[57] ABSTRACT

Reset, clamp, and sample pulses for a CCD sensor for electronic imaging applications are generated which have their leading edges delayed with respect to the leading edges of corresponding pixel clock pulses by substantially constant proportions of the pixel clock period independently of pixel frequency. To do this, a first auxiliary 50 percent duty cycle pulse train is generated having a frequency 4 times the pixel frequency. A divide by 4 counter receives the first auxiliary train and produces both the pixel clock itself and a second auxiliary 50 percent duty cycle pulse train having a frequency twice the pixel frequency. A 3 to 8 line decoder receives the pixel clock and both auxiliary trains to produce eight separate trains of pulses having the pixel frequency and a substantially 12.5 percent duty cycle. Each of the eight separate trains has the leading edge of its pulses delayed by substantially an eighth of the pixel clock period from the leading edge of the pulses of a different one of the eight separate trains. Different ones of the eight separate rains are selected to form the desired trains of reset, clamp, and sample pulses.

16 Claims, 3 Drawing Sheets

TRACKING CONTROL PULSE GENERATION FOR VARIABLE FRAME RATE CCD SENSORS FOR ELECTRONIC IMAGING APPLICATIONS

FIELD OF THE INVENTION

This invention relates generally to the generation of control pulses with predetermined timing relationships between their leading edges and those of another pulse train and, more particularly, to the generation of reset, sample, and clamp pulses for CCD (charge coupled device) sensors used for electronic imaging applications with variable frame rates.

BACKGROUND OF THE INVENTION

In a CCD sensor for electronic imaging applications, the horizontal frame rate is determined by a waveform commonly known as the pixel clock. The pixel clock is typically a train of pulses having a substantially 50 percent duty cycle at a constant repetition rate known as the pixel frequency. To extract a video signal from the CCD sensor, three trains of additional control pulses are needed, all having specific timing relationships with respect to the pixel clock. Each pulse of the first train, called a reset pulse, biases an output FET (field effect transistor) amplifier of the CCD sensor to a precharge level. The pixel clock moves the charge representing information out of the CCD sensor. A correlated double sample and hold circuit is normally provided in association with the CCD sensor to extract the value of the video signal. The correlated double sample and hold circuit needs two precisely positioned pulses to operate, namely, a clamp pulse and a sample pulse. The clamp pulses form the second of the three trains of additional control pulses and the sample pulses the third. For the CCD sensor to operate properly, the leading edges of the reset, clamp, and sample pulses need to be precisely positioned with respect to the leading edges of the corresponding pixel clock pulses as respectively different proportions of the period of the pixel clock. If the pixel frequency (and, hence, the horizontal frame rate of the CCD sensor) is changed, it is important that the relative timing relationships between the reset, clamp, and sample pulses and the pixel clock, as respectively different proportions of the pixel clock period, track one another by remaining the same.

In the past, the general practice in the art has been to delay the leading edges of the reset, clamp, and sample pulses with respect to the leading edges of the corresponding pixel clock pulses with fixed time delay circuits. Such circuits, which may be either digital or analog, are commonly known as skewing circuits. Although skewing circuits are satisfactory as long as the pixel frequency remains constant, problems arise if the pixel frequency is changed. Because the time delay introduced by each skewing circuit is not frequency dependent, the delay becomes a larger proportion of the pixel clock period if the pixel frequency is increased (decreasing the pixel clock period) or a smaller proportion of the pixel clock period if the pixel frequency is decreased (increasing the pixel clock period). To avoid undesirable changes in the proportions of the pixel clock period constituting the delays for the respective control pulses, it has been necessary to change skewing circuits whenever the pixel frequency is changed. Changing skewing circuits has been an undesirable complication and expense.

SUMMARY OF THE INVENTION

The present invention solves these problems of the prior art and permits reset, clamp, and sample pulses to be generated in such a manner that their leading edges automatically retain the same relative delays from the leading edges of corresponding pulses of the pixel clock, measured as proportions of the pixel clock period, as the frequency of the pixel clock is changed.

Broadly, the invention takes the form of an arrangement for generating a master train of pulses having a substantially 50 percent duty cycle and a frequency f and at least one train of control pulses having the same frequency f in which each of the control pulses has its leading edge delayed in time from the leading edge of a corresponding pulse of the master train by a constant proportion of the period of the master train. To accomplish this end, a first auxiliary train of pulses is generated having a substantially 50 percent duty cycle and a frequency 4f. A divide by 4 counter receives the first auxiliary train and produces both the master train itself and a second auxiliary train of pulses having a substantially 50 percent duty cycle and a frequency 2f. A 3 to 8 line decoder receives the master train and the first and second auxiliary trains to produce eight separate trains of pulses each having the frequency f and a pulse length no greater than substantially an eighth of the period of the master train.

Each of the eight separate trains thus produced has the leading edge of its pulses delayed by substantially an eighth of the period of the master train from the leading edge of the pulses of a different one of the others of the eight separate trains. The eight separate trains are thus effectively staggered in time with respect to one another by a delay of substantially an eighth of the period of the master train. Finally, one of the eight separate trains is selected to form the desired train of control pulses. Because of the manner in which they are generated, the leading edges of the control pulses maintain the same delay with respect to the leading edges of the pulses of the master train, measured as a proportion of the period of the master train, even when the frequency f is changed. No fixed delay skewing circuits need to be changed.

Even more broadly, the invention takes the form of such an arrangement in which a first auxiliary train of pulses is generated having a substantially 50 percent duty cycle and a frequency $(2^n)f$, where f is the frequency of the master train and n is an integer greater than one. A divide by $2^n$ counter receives the first auxiliary train and produces n additional auxiliary trains of pulses, one of which is the master train (having the frequency f) and each having a substantially 50 percent duty cycle and frequencies related to that of the master train by sequential powers of 2. A $(n+1)$ to $2^{(n+1)}$ line decoder receives all of the auxiliary trains to produce $2^{(n+1)}$ separate trains of pulses each having the frequency f and a pulse length no greater than substantially a $2^{-(n+1)}$ portion of the period of the master train.

Each of the $2^{(n+1)}$ separate trains thus produced has the leading edge of its pulses delayed by substantially a $2^{-(n+1)}$ portion of the period of the master train from the leading edge of the pulses of a different one of the other of the $2^{(n+1)}$ separate trains. The $2^{(n+1)}$ separate trains are thus effectively staggered in time with respect to one another by a delay of substantially a $2^{-(n+1)}$ portion of the period of the master train. Finally, one of the $2^{(n+1)}$ separate trains is selected to form the desired train of control pulses. Because of the manner in which they are generated, the leading edges of the control pulses maintain the same delay with respect to the leading edges of the pulses of the master train, measured as a proportion of the period of the master train, even when the frequency f is changed. Once again, no fixed delay skewing circuits need to be changed.

More specifically, in accordance with the invention, the master train of pulses is the pixel clock, and the one or more trains of control pulses constitute control pulses for extracting a video signal from a CCD sensor for electronic imaging applications. Even more specifically, control pulses may be generated in the form of one train of reset pulses, a second train of clamp pulses, and a third train of sample pulses. Each train of control pulses is delayed by a different amount relative to the pixel clock but each train has the same frequency as the pixel clock and maintains its same delay, measured as respective percentages of the period of the pixel clock, even when the pixel frequency is changed.

From a further aspect, the invention compensates for the time delay introduced by internal gate delay in the counter and for a cumulative time delay $D_t$ introduced by internal gate delays in the decoder and the final selector at high pixel clock or master pulse train frequencies, particularly when $D_t$ becomes a significant fraction of the pixel clock or master pulse train period. In accordance with this further aspect of the invention, one fixed gate delay, substantially matching the gate delay introduced by the counter, is inserted serially into the first high frequency auxiliary train between the high frequency pulse generator and the counter. The high frequency train is the train having the frequency 4f or $(2^n)f$ in the examples given above. In addition, means are provided for selectively inserting $(m-1)$ individual gate delays serially into the train of control pulses produced by the decoder, where m is a positive integer. Suitable logic circuitry, which may be of any type well known in the art, is provided for selecting the number of gate delays needed by the particular application for precise compensation. In the context of CCD sensors, where the control pulses are reset, clamp, and sample pulses, the number of individual gate delays inserted into each train need not all be the same.

From a still further aspect of the invention, additional control over gate delay compensation is provided by selectively inserting $(m-1)$ gate delays serially into the pixel clock or master pulse train itself, where m is again a positive integer and need not be the same as any of the values of m for the trains of control pulses. Such additional control may be particularly useful when the period of the pixel clock or master pulse train is not an integral multiple of the cumulative time delay $D_t$.

The invention may be more fully understood from the following detailed description of several specific embodiments, taken in the light of the accompanying drawing and the appended claims.

DETAILED DESCRIPTION

Figure 1:
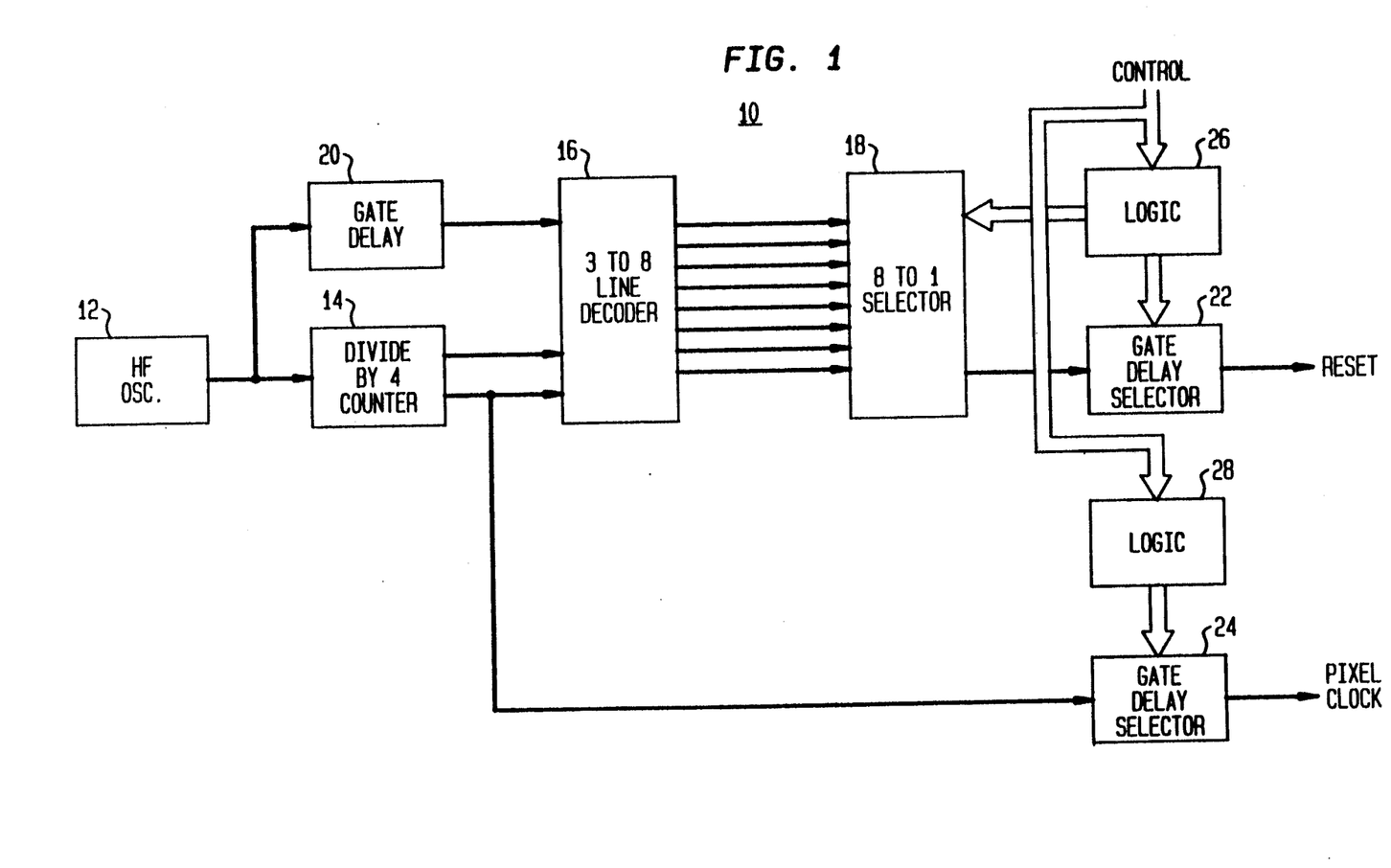
FIG. 1 is a block diagram of apparatus embodying the invention for producing a master train of pulses and a single train of control pulses delayed in time with respect to the master train, where the master train may be the pixel clock for a CCD sensor and the train of control pulses may be a train of reset, clamp, or sample pulses.

In FIG. 1, apparatus 10 is an embodiment of the invention which generates both a pixel clock waveform (hereinafter referred to simply as the pixel clock) for a CCD sensor (not shown) for electronic imaging applications and a single train of reset control pulses. Both the pixel clock and the train of reset pulses have the same frequency f. As will be explained in more detail later, the pixel clock is a pulse train having a duty cycle of substantially 50 percent, while the train of reset pulses has a duty cycle of substantially 12.5 percent. Broadly, the pixel clock may be looked upon as a master pulse train and the train of reset pulses may be looked upon as a train of control pulses delayed from the master pulse train by a constant proportion of the period of the master pulse train.

The principal components of apparatus 10 are a high frequency oscillator (HF OSC) 12 operating at a frequency of 4f (4 times the pixel frequency), a divide by four counter 14, a 3 to 8 line decoder 16, an 8 to 1 selector 18, a gate delay circuit 20, two gate delay selectors 22 and 24, and two logic circuits 26 and 28. As shown, output from oscillator 12 is supplied both to counter 14 and to gate delay circuit 20. Counter 14 has two outputs, both of which are supplied to 3 to 8 line decoder 16. Gate delay circuit 20 has a single output which is supplied to 3 to 8 line decoder 16. Decoder 16 has eight separate outputs, all of Which are supplied to 8 to 1 selector 18, which has a single output. The output from selector 18 is supplied to an input of gate delay selector 22. One of the outputs from counter 14 is supplied to an input of gate delay selector 24. Logic circuit 26 controls both gate delay selector 22 and selector 18, while logic circuit 28 controls gate delay selector 24. Output from gate delay selector 22 represents the final reset pulse train generated by apparatus 10, while output from gate delay selector 24 represents the final pixel clock.

Oscillator 12 generates a train of pulses having a duty cycle of substantially 50 percent. In other words, the length of each of its pulses in time is substantially equal to the interval between pulses. As previously stated, the frequency of the pulse train generated by oscillator 12 is 4f, or four times the pixel frequency. As shown, the output from gate delay circuit 20, which is a 50 percent duty cycle pulse train having a frequency 4f, is supplied to an input of decoder 16. Counter 14 accepts an input pulse train of one frequency and produces respective output pulse trains of half and a quarter of the frequency of the input pulse train. The two outputs of counter 14 thus carry, respectively, a 50 percent duty cycle pulse train having a frequency 2f (at the upper of the two outputs shown) and a 50 percent duty cycle pulse train having a frequency f (at the lower of the two outputs shown). Both outputs of counter 14 are supplied to inputs of decoder 16. The output from counter 14 having a frequency f (the lower of the two outputs shown) is itself the desired pixel clock or, more broadly, the desired master pulse train.

Decoder 16 is a type of digital logic circuit common in the art which accepts three 50 percent duty cycle pulse trains of respective frequencies f, 2f, and 4f and generates eight output pulse trains each having the frequency f and duty cycles of substantially 12.5 percent and which are each delayed with respect to one another by one of their own pulse lengths. Operation of decoder 16 is thus illustrated below in Tables 1 and 2.

TABLE 1

| t  | — | 1 | 2 | 3 | 4 | 5 | 6 | 7 | 8 |
|----|---|---|---|---|---|---|---|---|---|
| f  | — | 1 | 1 | 1 | 1 | 0 | 0 | 0 | 0 |
| 2f | — | 1 | 1 | 0 | 0 | 1 | 1 | 0 | 0 |
| 4f | — | 1 | 0 | 1 | 0 | 1 | 0 | 1 | 0 |

Table 1 illustrates the three 50 percent duty cycle inputs to decoder 16 in digital (ones and zeros) form. The first row of Table 1 identifies eight successive time slots t making up a complete cycle or period of the pixel clock or master pulse train. Each time slot thus represents 12.5 percent of the pixel clock period. The second row of Table 1 shows the digital logic represented by the frequency f applied to decoder 16, the third row shows the digital logic represented by the frequency 2f applied to decoder 16, and the fourth row shows the digital logic represented by the frequency 4f applied to decoder 16. As would be expected, the second row of Table 1 contains one full cycle or period of the waveform it portrays, the third row contains two full cycles or periods of the waveform it portrays, while the fourth row contains four full cycle or periods of the waveform it portrays.

TABLE 2

| t | — | 1 | 2 | 3 | 4 | 5 | 6 | 7 | 8 |
|---|---|---|---|---|---|---|---|---|---|
| 1 | — | 1 | 0 | 0 | 0 | 0 | 0 | 0 | 0 |
| 2 | — | 0 | 1 | 0 | 0 | 0 | 0 | 0 | 0 |
| 3 | — | 0 | 0 | 1 | 0 | 0 | 0 | 0 | 0 |
| 4 | — | 0 | 0 | 0 | 1 | 0 | 0 | 0 | 0 |
| 5 | — | 0 | 0 | 0 | 0 | 1 | 0 | 0 | 0 |
| 6 | — | 0 | 0 | 0 | 0 | 0 | 1 | 0 | 0 |
| 7 | — | 0 | 0 | 0 | 0 | 0 | 0 | 1 | 0 |
| 8 | — | 0 | 0 | 0 | 0 | 0 | 0 | 0 | 1 |

Table 2 illustrates the eight 12.5 percent duty cycle output pulse trains from decoder 16 in digital form. The first row again identifies eight successive time slots (the same time slots identified in Table 1) making up a complete cycle or period of the portrayed trains. Each successive subsequent row in Table 2 is a digital representation of a respective one of the output pulse trains. As shown, each pulse (logical one) is delayed from the preceding train by one pulse length, i.e., by an eighth of the period of the pixel clock or master pulse train.

Selector 18 is a type of digital logic circuit or switch common in the art which selects one of the eight output pulse trains from decoder 16 based on a binary signal from logic 26 provided on three lines as the reset pulse train or, more broadly, as the control pulse train. The particular one of the eight trains selected depends upon the amount of delay relative to the pixel clock or master pulse train needed for the particular application at hand. By way of example, if the second pulse train in Table 2 is selected, the leading edge of each of its pulses is delayed by one pulse length (i.e., by one eighth of the period of the pixel clock or master pulse train) from the leading edge of the corresponding pulse of the pixel clock or master pulse train.

Gate delay selector 22 is a conventional digital switch that selects (m−1) gate delays, where m is a positive integer, and inserts them serially into the pulse train selected by selector 18. Thus, the cumulative number of gate delays inserted into the selected pulse train may be zero, one, two, or any other chosen positive integral number.

Logic circuit 26 may be a conventional programmable circuit and is included merely to illustrate that external control may be provided to determine (1) just which one of the output pulse trains from decoder 16 is selected to form the train of reset pulses (or, more broadly, the train of control pulse), and (2) the number of individual gate delays inserted into the selected pulse train by gate delay selector 22. External control may be provided for logic circuit 26 to indicate the pixel frequency set by high frequency oscillator 12. Gate delay selector 24 is similar to gate delay selector 22 and selects (m−1) gate delays, where m is a positive integer, and inserts them serially into the pixel clock (or master pulse train) from counter 14. External control may also be provided for logic circuit 28 to indicate the pixel clock frequency. Logic 26 and 28 receive control signals and provide gate selector signals to logical gates 22 and 24. The integer m need not be identical for both gate delay selector 22 and gate delay selector 24.

Table 2 illustrates generation of the eight separate pulse trains by decoder 16, without regard to the cumulative time delay $D_t$ which may be encountered in decoder 16 and (prospectively) in selector 18 at some high pixel clock frequencies. Application of three 50 percent duty cycle pulse trains (having frequencies of f, 2f, and 4f, respectively) to decoder 16 permits generation of eight separate pulse trains from decoder 16. Each of these eight pulse trains has its pulses delayed one pulse length (its own pulse length, which is only a quarter of the pulse length of the pixel clock or master pulse train—row 2 of Table 1) from the preceding pulse train. With no gate delay to account for, the leading edge of the pulses of pulse train 1 occurs substantially simultaneously with the leading edge of the pixel clock pulses, the leading edge of the pulses of pulse train 2 is delayed one pulse length, the leading edge of the pulses of pulse train 3 is delayed two pulse lengths, and so on. Selection of one of the eight individual pulse trains to form the desired train of reset pulses (or, more broadly, control pulses) is made depending upon the requirements of the application at hand. In the context of a CCD sensor, pulse train 2 may be the preferred choice.

The advantage secured over the prior art by the present invention is that, whatever the pulse train selected by selector 18, that pulse train tracks the pixel clock when the pixel frequency is changed. In other words, the time delay of the leading edges of the selected pulse train, relative to those of the pixel clock (or master pulse train) measured as a percentage of the pixel clock period, remains constant even when the pixel frequency is changed. For each of the eight pulse trains generated by decoder 16, its pulse length (and, hence, the amount of its delay) remains constant at substantially 12.5 percent of the period of the pixel clock. Were skewing circuits to be used in the manner of the prior art, substantial changes in pixel frequency would require substitution of different skewing circuits to permit the device controlled by the generated pulse trains (e.g., a CCD sensor for electronic imaging applications) to continue to operate satisfactorily.

For a CCD sensor, a pixel frequency of 10 MHz is typical. For pixel frequencies of that order of magnitude, the cumulative time delay $D_t$ is not a significant fraction of the pixel clock period. Under such circumstances, gate delay selectors 22 and 24 either need not be present or may be set to insert zero gate delays into their respective pixel clock and reset pulse trains. Similarly, logic circuit 28 need not be present if the pixel clock frequency is only in the vicinity of 10 MHz. For higher pixel clock frequencies, such as 15 or 21 MHz, cumulative time delay $D_t$ amounts to a more significant fraction of the pixel clock period and needs to be taken into account. In general, one gate delay tends to be introduced by the digital circuitry of each of counter 14, decoder 16, and selector 18. Because the magnitude of the cumulative time delay $D_t$ through decoder 16 and selector 18 is substantially independent of pixel frequency, compensation may be necessary at pixel frequencies of 15 or 21 MHz. The reason is that $D_t$ then becomes a more substantial fraction of the pixel clock period.

Figure 2:
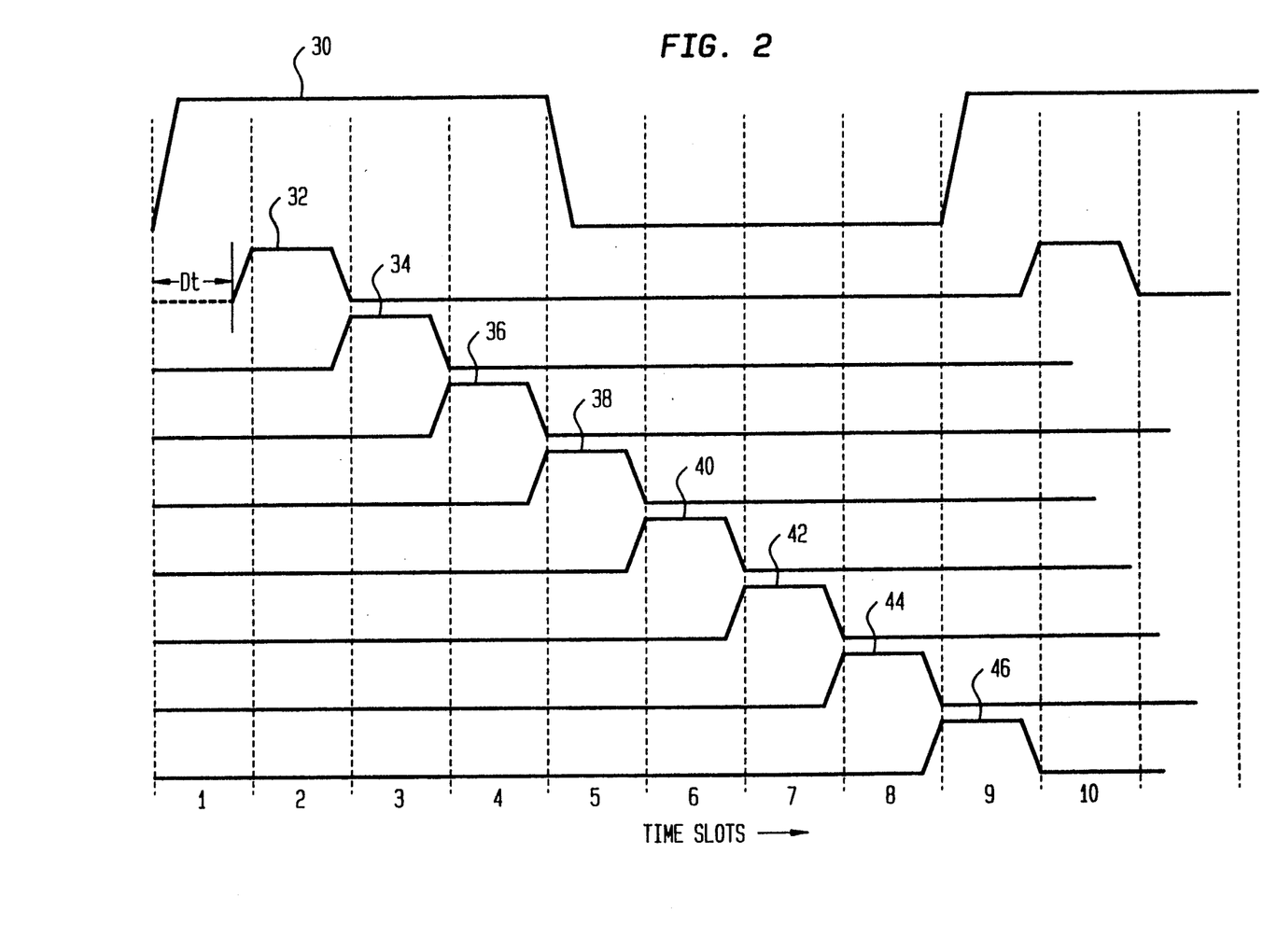
FIG. 2 illustrates waveforms of the separate staggered pulse trains generated by the decoder in the apparatus of FIG. 1.

FIG. 2 illustrates actual waveforms of both the pixel clock (master pulse train) of apparatus 10 in FIG. 1 and the eight separate 12.5 duty cycle pulse trains produced by decoder 16 at a pixel clock frequency such as 15 MHz, where cumulative time delay $D_t$ begins to become significant. In FIG. 2, the ordinate represents amplitude and the abscissa represents time. Ten consecutive time slots are shown from left to right, with eight time slots representing the period of the pixel clock.

Waveform 30 is the pixel clock itself (more broadly, the master pulse train) as applied to the input of decoder 16. As shown, the pixel clock has a duty cycle of substantially 50 percent. As a result, waveform 30 is at its maximum during the first four time slots of each period and at its minimum during the next four, before repeating the cycle during the next eight time slots.

Waveform 32 is the first of the eight separate pulse trains produced at outputs of decoder 16. Because of the cumulative time delay $D_t$ introduced within decoder 16 and (prospectively) within selector 18, waveform 32 is at its maximum during the second of the illustrated time slots. Waveform 34 is the second of the eight pulse trains emanating from decoder 16 and is at its maximum during the third time slot. Waveform 36 is the third of the eight pulse trains and is at its maximum during the fourth time slot. Waveform 38 is the fourth of the eight pulse trains and is at its maximum during the fifth time slot. Waveform 40 is the fifth of the eight pulse trains and is at its maximum during the sixth time slot. Waveform 42 is the sixth of the eight pulse trains and is at its maximum during the seventh time slot. Waveform 44 is the seventh of the eight pulse trains and is at its maximum during the eighth time slot. Waveform 46 is the eighth and last of the eight pulse trains and is at its maximum during the ninth time slot.

For a pixel clock frequency of 15 MHz or above, the operation of gate delay selectors 22 and 24 become important. Gate delay circuit 20 first inserts one gate delay into the output of high frequency oscillator 12 as supplied to decoder 16. This gate delay compensates for the gate delay introduced by counter 14 into the second auxiliary pulse train and the pixel clock as supplied to decoder 16. One gate delay is introduced by decoder 16 into each of the eight pulse trains produced by decoder 16 and one gate delay is introduced by selector 18 into the pulse train finally selected as the reset pulse train. As indicated earlier, the cumulative time delay $D_t$ is the sum of these latter two gate delays.

But for the circumstance that some CCD sensor characteristics such as rise time and fall time are also substantially independent of frequency, it might be possible to compensate for the cumulative time delay $D_t$ by setting gate delay selector 24 to insert two gate delays serially into the pixel clock. Because such a solution would not necessarily yield optimum results, the requirements of any particular apparatus need to be determined experimentally and the results used to program respective logic circuits 26 and 28. As a result, one value of m may be used for gate delay selector 22 and another value of m used for gate delay selector 24. In one example, insertion of one gate delay into the reset pulse train by gate delay selector 22 and insertion of zero gate delays into the pixel clock, accompanied by selection of the optimum pulse train by selector 18, have been found to yield the best results.

Selective gate delay insertions become even more important at a pixel clock frequency of 21 MHz. Because of CCD sensor characteristics, for at least one example the optimum number of gate delays to be inserted serially in the reset pulse train has been found to be two and the number of gate delays to be inserted serially in the pixel clock has been found to be zero.

An important advantage of this aspect of applicant's invention is that, once the optimum numbers of gate delays to be inserted serially into the reset pulse train or into the pixel clock have been determined those optimum numbers, as well as the identity of the pulse train to be selected by selector 18, may be programmed into logic circuits 26 and 28. Thus, as control signals are supplied to logic circuits 26 and 28 to indicate the desired pixel frequency (set by high frequency oscillator 12), apparatus 10 automatically adjusts to provide a reset pulse train that has precisely the correct relationship to the pixel clock. If the pixel frequency is changed, apparatus 10 automatically adjusts to retain the correct relationship.

Figure 3:
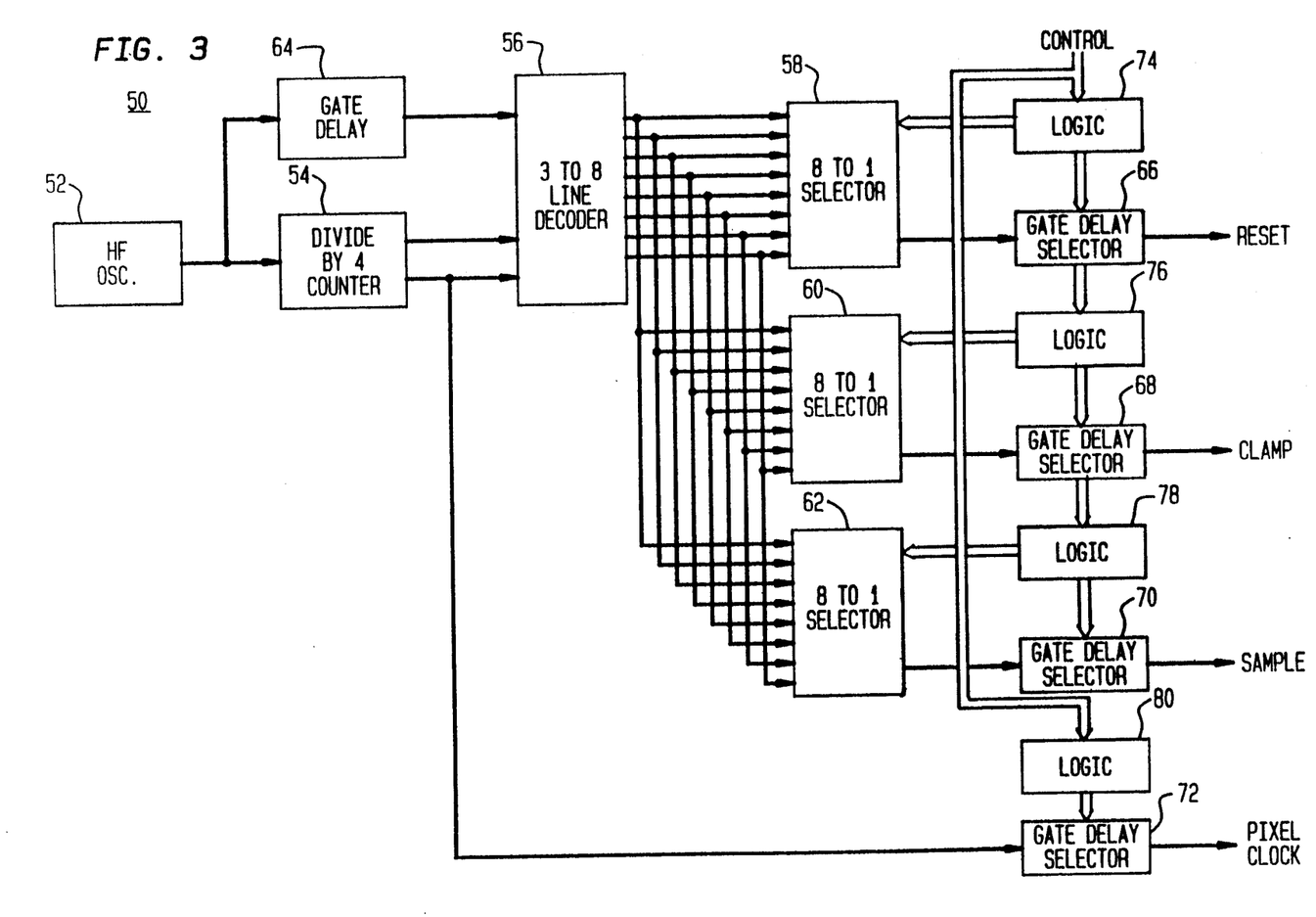
FIG. 3 is a block diagram of apparatus embodying the invention for producing a pixel clock for a CCD sensor and respective trains of reset, clamp, and sample pulses, each of which is delayed in time with respect to the pixel clock by a respective constant proportion of the pixel clock period.

In FIG. 3, apparatus 50 is a further embodiment of the invention which not only generates a pixel clock waveform for a CCD sensor (not shown) for electronic imaging applications but also generates respective trains of reset, clamp, and sample control pulses. The pixel clock and all three trains of control pulses have the same frequency f. The pixel clock is a pulse train having a duty cycle of substantially 50 percent, while each of the three control pulse trains has a duty cycle of substantially 12.5 percent. Broadly, the pixel clock may be looked upon as a master pulse train and the respective trains of reset, clamp, and sample pulses may be looked upon as separate trains of control pulses delayed from the master pulse train by respectively different but constant proportions of the period of the master pulse train.

Apparatus 50 is substantially identical to apparatus 10 in FIG. 1, with the exception that apparatus 50 produces three separate trains of control pulses (the reset, clamp, and sample pulse trains) instead of only one.

The principal components of apparatus 50 are a high frequency oscillator 52 operating at a frequency of 4f (4 times the pixel frequency), a divide by four counter 54, a 3 to 8 line decoder 56, three 8 to 1 selectors 58, 60, and 62, a gate delay circuit 64, four gate delay selectors 66, 68, 70, and 72, and four logic circuits 74, 76, 78, and 80. As shown, output from high frequency oscillator 52 is supplied both to counter 54 and to gate delay circuit 64. Counter 54 has two outputs, both of which are supplied to 3 to 8 line decoder 56. Gate delay circuit 64 has a single output which is supplied to decoder 56. Decoder 56 has eight separate outputs, all of which are supplied to each of selectors 58, 60, and 62. Each of selectors 58, 60, and 62 has a single output. The output from selector 58 is supplied to an input of gate delay selector 66, the output from selector 60 is supplied to an input of gate delay selector 68, and the output from selector 62 is supplied to an input of gate delay selector 70. One of the outputs of counter 54 (the one having the frequency f) is the pixel clock and is supplied to an input of gate delay selector 72. Logic circuit 74 has outputs which control both gate delay selector circuit 66 and selector 58. Logic circuit 76 has outputs which control both gate delay selector 68 and selector 60. Logic circuit 78 has outputs which control both gate delay selector 70 and selector 62. Logic circuit 80 has an output which controls gate delay selector 72. Output from gate delay selector 66 represents the final reset pulse train generated by apparatus 10, output from gate delay selector 68 represents the final clamp pulse train, output from gate delay selector 70 represents the final sample pulse train, and output from gate delay selector 72 represents the final pixel clock.

Oscillator 52 generates a train of pulses having a duty cycle of substantially 50 percent. In other words, the length of each of its pulses in time is substantially equal to the interval between pulses. As previously stated, the frequency of the pulse train generated by oscillator 52 is 4f, or four times the desired pixel frequency. As shown, the output from gate delay circuit 64, which is a 50 percent duty cycle pulse train having a frequency 4f, is supplied to an input of decoder 56. Counter 54 accepts an input pulse train of one frequency and produces respective output pulse trains of half and a quarter of the frequency of the input pulse train. The two outputs of counter 54 thus carry, respectively, a 50 percent duty cycle pulse train having a frequency 2f and a 50 percent duty cycle pulse train having a frequency f. Both outputs of counter 54 are supplied to inputs of decoder 56. Of the two outputs from counter 54, the one having a frequency f is itself the desired pixel clock or, more broadly, the desired master pulse train.

Decoder 56 is a digital logic circuit which accepts three 50 percent duty cycle pulse trains of respective frequencies f, 2f, and 4f and generates eight output pulse trains each having the frequency f and duty cycles of substantially 12.5 percent and which are delayed with respect to one another by one of their own pulse lengths. Operation of decoder 56 is the same as is illustrated in connection with FIG. 1 by Tables 1 and 2.

Selectors 58, 60, and 62 are digital logic circuits or switches each of which selects one of the eight output pulse trains from decoder 16 as the reset, clamp, and control pulse trains or, more broadly, as three separate control pulse trains. In each instance, the one of the eight trains selected depends upon the number of pulse lengths of delay needed for a particular application. By way of example, if the second pulse train is selected as the reset pulse train, the leading edge of each of its pulses is delayed by one pulse length (i.e., by one eighth of the period of the pixel clock or master pulse train) from the leading edge of the corresponding pulse of the pixel clock or master pulse train. Similarly, if the third pulse train is selected as the clamp pulse train, the leading edge of each of its pulses is delayed by two pulse lengths and, if the fifth pulse train is selected as the sample pulse train, the leading edge of each of its pulses is delayed by four pulse lengths.

Gate delay selectors 66, 68, and 70 are digital switches, each of which selects (m−1) gate delays, where m is a positive integer and may be different for each gate delay selector, and inserts them serially into the pulse trains selected respectively by selectors 58, 60, and 62. Thus, the cumulative number of gate delays inserted into any of the pulse trains may be zero, one, two, or any other selected positive integral number.

Logic circuits 74, 76, and 78 may take any form desired and are included to illustrate that external control may be provided to determine (1) just which of the output pulse trains from decoder 56 are selected to form the trains of reset, clamp, and sample pulses (or, more broadly, the three trains of control pulses), and (2) the number of individual gate delays inserted into and 70. External control may be provided for logic circuits 74, 76, and 78 to indicate the selected pixel clock frequency. Gate delay selector 72 is similar to gate delay selectors 66, 68, and 70 and selects (m−1) gate delays, where m is a positive integer, and inserts them serially into the pixel clock (or master pulse train) from counter 54. External control may be provided for logic circuit 80 to indicate the pixel clock frequency. The integer m need not be identical for all of gate delay selectors 66, 68, 70 and 72.

As it did for decoder 16 of apparatus 10 in FIG. 1, Table 2 illustrates generation of the eight separate pulse trains by decoder 56 without regard to individual gate delays which may be encountered in decoder 56 and selectors 58, 60, and 62 at some high pixel clock frequencies. Application of three 50 percent duty cycle pulse trains (having frequencies of f, 2f, and 4f, respectively) to decoder 56 permits generation of eight separate pulse trains from decoder 56 each of which has its pulses delayed one pulse length (its own pulse length, which is only a quarter of the pulse length of the pixel clock—row 2 of Table 1) from the preceding pulse train. With no cumulative time delay $D_t$ to account for, the leading edge of the pulses of pulse train 1 occurs substantially simultaneously with the leading edge of the pixel clock pulses, the leading edge of the pulses of pulse train 2 are delayed one pulse length, the leading edge of the pulses of pulse train 3 are delayed two pulse lengths, and so on. Selection of three of the eight individual pulse trains to form the desired trains of reset pulses, clamp pulses, and sample pulses is made depending upon the requirements of the particular application. In the context of a CCD sensor, pulse trains 2, 3, and 5 are frequently found to be the best choices.

The advantage secured over the prior art by the present invention is that, whatever the pulse trains selected by selectors 58, 60, and 62, the time delays of their leading edges relative to those of the pixel clock, measured as a percentage of the pixel clock period, track and remain constant even when the pixel frequency is changed. For each of the eight pulse trains generated by decoder 16, its pulse length (and, hence, the amount of its delay) remains constant at substantially 12.5 percent of the period of the pixel clock. Were skewing circuits to be used in the manner of the prior art, substantial changes in pixel frequency would require substitution of different skewing circuits in order to avoid disabling the CCD sensor.

For a CCD sensor, a pixel clock frequency of 10 MHz is typical. For pixel clock frequencies of that order of magnitude, the cumulative time delay $D_t$ is not a significant fraction of the pixel clock period. Under such circumstances, gate delay selectors 74, 76, 78, and 80 either need not be present or may be set to insert zero gate delays into the respective pixel clock and reset, clamp, and sample pulse trains. Similarly, logic circuits 74, 76, 78, and 80 need not be present if the pixel frequency is only in the vicinity of 10 MHz. For higher pixel frequencies, such as 15 or 21 MHz, the cumulative time delay $D_t$ amounts to a more significant fraction of the pixel clock period and needs to be taken into account. In general, one gate delay tends to be introduced by the digital circuitry of each of counter 54, decoder 56, and selectors 58, 60, and 62. Because the magnitude of $D_t$ (the sum of the gate delays of decoder 56 and any one of selectors 58, 60, and 62) is substantially independent of pixel frequency, compensation may be necessary at pixel frequencies of 15 or 21 MHz because the cumulative time delay $D_t$ then becomes a more substantial fraction of the pixel clock period.

FIG. 2 also illustrates actual waveforms of both the pixel clock of apparatus 50 of FIG. 3 and the eight separate 12.5 duty cycle pulse trains produced by decoder 56 at a pixel clock frequency such as 15 MHz, where the cumulative time delay $D_t$ begins to become significant. In FIG. 2, as was explained previously in connection with apparatus 10 of FIG. 1, the ordinate represents amplitude and the abscissa represents time. Ten consecutive time slots are shown from left to right, with eight time slots representing the period of the pixel clock.

Waveform 30 is the pixel clock itself (more broadly, the master pulse train) as applied to the input of decoder 56. As shown, the pixel clock has a duty cycle of substantially 50 percent. As a result, waveform 30 is at its maximum during the first four time slots of each period and at its minimum during the next four, before repeating the cycle during the next eight time slots.

Waveform 32 is the first of the eight separate pulse trains produced at outputs of decoder 56. Because of the cumulative time delay $D_t$, waveform 32 is at its maximum during the second of the illustrated time slots. Waveform 34 is the second of the eight pulse trains emanating from decoder 16 and is at its maximum during the third time slot. Waveform 36 is the third of the eight pulse trains and is at its maximum during the fourth time slot. Waveform 38 is the fourth of the eight pulse trains and is at its maximum during the fifth time slot. Waveform 40 is the fifth of the eight pulse trains and is at its maximum during the sixth time slot. Waveform 42 is the sixth of the eight pulse trains and is at its maximum during the seventh time slot. Waveform 44 is the seventh of the eight pulse trains and is at its maximum during the eighth time slot. Waveform 46 is the eighth and last of the eight pulse trains and is at its maximum during the ninth time slot.

For a pixel frequency of 15 MHz or above, the operation of gate delay selectors 66, 68, 70, and 72 becomes significant. Gate delay circuit 64 already inserts one gate delay into the output of high frequency oscillator 52 as supplied to decoder 56. This gate delay compensates for the gate delay introduced by counter 54 into the second auxiliary pulse train and the pixel clock as supplied to decoder 56. One additional gate delay is introduced by decoder 56 into each of the eight pulse trains produced by decoder 56 and one final gate delay is introduced by selectors 58, 60, and 62 into the pulse trains finally selected as the reset, clamp, and sample pulse trains.

But for the circumstance that some CCD sensor characteristics such as rise time and fall time are also substantially independent of frequency, it might be possible to compensate for the two additional gate delays simply by programming gate delay selector 72 to insert two gate delays serially into the pixel clock. Because such a solution would not necessarily yield optimum results, the requirements of any particular apparatus need to be determined experimentally and the results used to program respective logic circuits 74, 76, 78, and 80. As a result, one value of m may be used for gate delay selector 74 and other values of m may be used for any of the other gate delay selectors 76, 78, and 80. For at least one example, insertion of one gate delay into each of the reset, clamp, and sample pulse trains by gate delay selectors 74, 76, and 78 and insertion of zero gate delays into the pixel clock, accompanied by selection of respectively different pulse trains by selectors 58, 60, and 62, have been found to yield satisfactory results.

Selective gate delay insertions become even more important at a pixel clock frequency of 21 MHz. Because of CCD imager sensor characteristics, the optimum number of gate delays to be inserted serially into the reset, clamp, and sample pulse trains in at least one example has been found to be two and the number of gate delays inserted serially into the pixel clock has been found to be zero.

An important advantage of this aspect of applicant's invention is that, once the optimum numbers of gate delays to be inserted serially into the reset pulse, clamp, and sample trains or into the pixel clock have been determined they, as well as the pulse trains to be selected by selectors 58, 60, and 62, may be programmed into logic circuits 74, 76, 78, and 80. Thus, as control signals are supplied to logic circuits 74, 76, 78, and 80 to indicate the desired pixel frequency (set by high frequency oscillator 52), apparatus 50 automatically adjusts to provide reset, clamp, and sample pulse trains that have precisely the correct relationships to the pixel clock. If the pixel frequency is changed, apparatus 50 automatically adjusts to retain those correct relationships.

The inventive concepts exemplified by apparatus 10 in FIG. 1 and by apparatus 50 in FIG. 3 may be further extended by using 8 or 16 times the pixel clock frequency in high frequency oscillators 12 and 52. Then, the resulting pulse widths are 1/16th or 1/32nd, respectively, of the pixel clock period. Even though a narrower pulse width results, the positions available for selection are respectively doubled or quadrupled.

Application of such extensions of the inventive concepts to apparatus 10 in FIG. 1 means that high frequency oscillator 12 has a frequency of $(2^n)f$, where n is an integer greater than one, and counter 14 is a divide by $2^n$ counter which produces n additional auxiliary trains of 50 percent duty cycle pulses, one of the additional auxiliary trains being the pixel clock having the frequency f. Further, decoder 16 is a (n+1) to $2^{(n+1)}$ line decoder which receives all auxiliary trains and produces $2^{(n-1)}$ separate pulse trains each having the frequency f and a pulse length of substantially a $2^{-(n+1)}$ portion of the period of the pixel clock. Each of the separate trains is delayed one pulse length from one another, i.e., by a $2^{-(n+1)}$ portion of the period of the pixel clock. Selector 18, finally, is a $2^{(n+1)}$ to 1 selector.

This expanded concept is applicable to apparatus 50 in FIG. 3 is the same manner as it is applicable to apparatus 10 in FIG. 1.

It is to be understood that the embodiments of the invention which have been described are illustrative.

Numerous other arrangements and modifications may be readily devised by those skilled in the art without departing from the spirit and scope of the invention.

What is claimed is:

1. Apparatus for generating a master train of pulses having a substantially 50 percent duty cycle and a frequency f and at least one train of control pulses having the same frequency f, each of said train of control pulses having its leading edge delayed in time from the leading edge of a corresponding pulse from said master train by a constant proportion of the period of said master train, said apparatus comprising:

means for generating a first auxiliary train of pulses having a substantially 50 percent duty cycle and a frequency 4f;

a divide by 4 counter connected to receive said first auxiliary train and produce both said master train and a second auxiliary train of pulses having a substantially 50 percent duty cycle and a frequency 2f;

a 3 to 8 line decoder connected to receive said master train and said first and second auxiliary trains and produce eight separate trains of pulses having the frequency f and a pulse length no greater than substantially an eighth of the period of said master train, each of said eight separate trains having the leading edge of its pulses delayed by substantially an eighth of the period of said master train from the leading edge of the pulses of one of the other of said eight separate trains; and means for selecting one of said eight separate trains of pulses to form said train of control pulses.

2. The apparatus of claim 1 in which said counter, said decoder, and said selecting means each has a substantially constant gate delay, said apparatus further comprising:

means for inserting one gate delay serially into said first auxiliary train between said generating means and said decoder; and means for selectively inserting $(m_1-1)$ gate delays serially into said train of control pulses as produced by said decoder, where m is a positive integer.

3. The apparatus of claim 2 further comprising means for selectively inserting $(m_2-1)$ gate delays serially into said master train as produced by said counter.

4. The apparatus of claim 3 in which $m_1$ and $m_2$ may have equal or different values for inserting gate delays into said train of control pulses and for inserting gate delays into said master train.

5. Apparatus for generating a master train of pulses having a substantially 50 percent duty cycle and a frequency f and at least one train of control pulses having the same frequency f, each of said train of control pulses having its leading edge delayed in time by a constant proportion of the period of said master train, said apparatus comprising:

means for generating a first auxiliary train of pulses having a substantially 50 percent duty cycle and a frequency $(2^n)f$, where n is an integer greater than one;

a divide by $2^n$ counter connected to receive said first auxiliary train and produce n additional auxiliary trains of pulses each having a substantially 50 percent duty cycle, one of said additional auxiliary trains being said master train and the remaining ones of said additional auxiliary trains being related in frequency to said master train by sequential powers of 2;

a $(n+1)$ to $2^{(n+1)}$ line decoder connected to receive said auxiliary trains and produce $2^{(n+1)}$ separate trains of pulses having the frequency f and a pulse length no greater than substantially a $2^{(n+1)}$ portion of the period of said master train, each of said $2^{(n+1)}$ separate trains having the leading edge o fits pulses delayed in time by substantially a $2^{(n+1)}$ portion of the period of said master train from the leading edge of the pulses of one of the other of said $2^{(n+1)}$ separate trains; and means for selecting one of said $2^{(n+1)}$ separate trains of pulses to form said train of control pulses.

6. The apparatus of claim 5 in which said counter, said decoder, and said selecting means each has a substantially constant gate delay, said apparatus further comprising:

means for inserting one gate delay serially into said first auxiliary train between said generating means and said decoder; and means for selectively inserting $(m_1-1)$ gate delays serially into said train of control pulses as produced by said decoder, where m is a positive integer.

7. The apparatus of claim 6 further comprising means for selectively inserting $(m_2-1)$ gate delays serially into said master train as produced by said counter.

8. The apparatus of claim 7 in which $m_1$ and $m_2$ may have equal or different values for inserting gate delays into said train of control pulses and for inserting gate delays into said master train.

9. Apparatus for generating a pixel clock for a CCD electronic imaging device, said pixel clock being a pulse train having a substantially 50 percent duty cycle and a frequency f, and at least one train of control pulses for extracting a video signal from the CCD device, said train of control pulses having the same frequency f, each of said train of control pulses having its leading edge delayed in time from the leading edge of a corresponding pulse from said pixel clock by a constant proportion of the period of said pixel clock, said apparatus comprising:

means for generating a first auxiliary train of pulses having a substantially 50 percent duty cycle and a frequency 4f;

a divide by 4 counter connected to receive said first auxiliary train and produce both said pixel clock and a second auxiliary train of pulses having a substantially 50 percent duty cycle and a frequency 2f;

a 3 to 8 line decoder connected to receive said pixel clock and said first and second auxiliary trains and produce eight separate trains of pulses having the frequency f and a pulse length no greater than substantially an eight of the period of said pixel clock, each of aid eight separate trains having the leading edge of its pulse delayed by substantially an eight of the period of said pixel clock from the leading edge of the pulses of one of the other of said eight separate trains; and means for selecting one of said eight separate trains of pulses to form said train of control pulses.

10. The apparatus of claim 9 in which said counter, said decoder, and said selecting means each has a substantially constant gate delay, said apparatus further comprising:

means for inserting one gate delay serially into said first auxiliary train between said generating means and means for selectively inserting ($m_1-1$) gate delays serially into said train of control pulses as produced by said decoder, where m is a positive integer.

11. The apparatus of claim 10 further comprising means for selectively inserting ($m_2-1$) gate delays serially into said pixel clock as produced by said counter.

12. The apparatus of claim 11 in which $m_1$ and $m_2$ may have equal or different values for inserting gate delays into said train of control pulses and for inserting gate delays into said pixel clock.

13. Apparatus for generating a pixel clock for a CCD electronic imaging device, said pixel clock being a pulse train having a substantially 50 percent duty cycle and a frequency f, and at least a one train of control pulses for extracting a video signal from the CCD device, said train of control pulses having the same frequency f, each of said train of control pulses having its leading edge delayed in time from the leading edge of a corresponding pulse from said pixel clock by a constant proportion of the period of said pixel clock, said apparatus comprising:

means for generating a first auxiliary train of pulses having a substantially 50 percent duty cycle and a frequency $(2^n)f$, where n is an integer greater than one;

a divide by $2^n$ counter connected to receive said first auxiliary train and produce n additional auxiliary trains or pulses each having a substantially 50 percent duty cycle, one of said additional auxiliary trains being said pixel clock and the remaining ones of said additional auxiliary trains being related in frequency to said pixel clock by sequential powers of 2;

a (n+1) to $2^{(n+1)}$ line decoder connected to receive said auxiliary trains and produce $2^{(n+1)}$ separate trains of pulses having the frequency f and a pulse length no greater than substantially a $2^{-(n+1)}$ portion of the period of said pixel clock, each of said $2^{(n+1)}$ separate trains having the leading edge of its pulses delayed in time by substantially a $2^{-(n+1)}$ portion of the period of said train of control pulses from the leading edge of the pulses of one of the other of said $2^{(n+1)}$ separate trains; and means for selecting one of said $2^{(n+1)}$ separate trains of pulses to form said train of control pulses.

14. The apparatus of claim 13 in which said counter, said decoder, and said selecting means each has a substantially constant gate delay, said apparatus further comprising:

means for inserting one gate delay serially into said first auxiliary train between said generating means and said decoder; and means for selectively inserting ($m_1-1$) gate delays serially into said train of control pulses as produced by said decoder, where m is a positive integer.

15. The apparatus of claim 14 further comprising means for selectively inserting ($m_2-1$) gate delays serially into said pixel clock as produced by said counter.

16. The apparatus of claim 15 in which $m_1$ and $m_2$ may have equal or different values for inserting gate delays into said train of control pulses and for inserting gate delays into said pixel clock.

* * * * *